(12) United States Patent
Xu et al.

(10) Patent No.: US 8,008,694 B2
(45) Date of Patent: Aug. 30, 2011

(54) BRIGHTNESS ENHANCEMENT METHOD AND APPARATUS OF LIGHT EMITTING DIODES

(75) Inventors: Li Xu, Saratoga, CA (US); Yi Li, Pleasanton, CA (US)

(73) Assignee: YLX, Ltd., George Town (KY)

( * ) Notice: Subject to any disclaimer, the term of this patent is extended or adjusted under 35 U.S.C. 154(b) by 276 days.

(21) Appl. No.: 12/442,153

(22) PCT Filed: Sep. 22, 2007

(86) PCT No.: PCT/US2007/079254
§ 371 (c)(1),
(2), (4) Date: Mar. 20, 2009

(87) PCT Pub. No.: WO2008/036958
PCT Pub. Date: Mar. 27, 2008

(65) Prior Publication Data
US 2010/0084671 A1    Apr. 8, 2010

Related U.S. Application Data (60) Provisional application No. 60/846,516, filed on Sep. 23, 2006.

(51) Int. Cl.
*H01L 31/062* (2006.01)
*H01L 31/113* (2006.01)

(52) U.S. Cl. ..... 257/290; 257/40; 257/78; 257/E21.278; 257/E21.352; 257/E21.366; 257/E21.4; 257/E21.499; 257/E21.527

(58) Field of Classification Search .................. 257/40, 257/79, 88, 290, 288, 310, 431, E21.278, 257/352, 366, 4, 499, 527
See application file for complete search history.

(56) References Cited

U.S. PATENT DOCUMENTS

| | | | |
|---|---|---|---|
| 6,784,462 B2 * | 8/2004 | Schubert | 257/98 |
| 6,798,469 B2 | 9/2004 | Kimura | |
| 6,841,803 B2 | 1/2005 | Aizawa et al. | |
| 6,849,878 B2 | 2/2005 | Bader et al. | |
| 2004/0135942 A1 * | 7/2004 | Lee et al. | 349/113 |
| 2005/0051791 A1 | 3/2005 | Gotoh et al. | |
| 2006/0050198 A1 | 3/2006 | Kirita et al. | |

FOREIGN PATENT DOCUMENTS

| | | |
|---|---|---|
| CN | 1517761 A | 8/2004 |
| CN | 1596041 A | 3/2005 |
| CN | 1805158 A | 7/2006 |
| WO | 2006035391 A1 | 4/2006 |

OTHER PUBLICATIONS

International Search Report and Written Opinion in counterpart PCT application No. PCT/US07/79254, dated Oct. 21, 2008.
Chinese Office Action, dated Jun. 4, 2010, in a counterpart Chinese patent application, No. 200780035026.8.

* cited by examiner

*Primary Examiner* — David Nhu
(74) *Attorney, Agent, or Firm* — Chen Yoshimura LLP (57) ABSTRACT

A light source with enhanced brightness includes an angle-selective optical filter and a light emitting diode (LED) having a high reflective layer. The angle-selective filter is located on the top surface of emitting diode to pass lights at specified angles. According to one embodiment, the angle-selective filter includes index-alternating layers. With a reflective polarizer, the light source can produce polarized light with enhanced brightness.

20 Claims, 8 Drawing Sheets

FIG 8

BRIGHTNESS ENHANCEMENT METHOD AND APPARATUS OF LIGHT EMITTING DIODES

This application is a 371 of PCT/US07/79254 filed Sep. 22, 2007.

This application claims priority from U.S. Provisional Patent Application No. 60/846,516, filed Sep. 23, 2006, which is herein incorporated by reference in its entirety.

BACKGROUND OF THE INVENTION

This application generally relates to semiconductor light sources including light emitting diodes.

Light sources of high brightness are desirable in various applications. Currently, light sources of high brightness used in many devices and systems are traditional light source such as HID lamps, lasers and other point light sources. Some of these traditional light sources have various technical limitations, including relatively short lifetimes, difficulty to control and maintain light color and relatively high manufacturing cost.

Solid-state light sources, especially light emitting diodes (LEDs), can be designed to have longer lifetimes, lower power consumption, more manageable emission wavelengths and other benefits in comparison with lamps and other light sources, and increasingly replace lamps and other light sources in a wide range of applications. However, there are many performances that LEDs need to be improved so that LEDs can further broaden its applications to replace lamps and other light sources. Recent advances in LEDs have intensified interests in using LEDs in lighting applications that demand high brightness.

SUMMARY OF THE INVENTION

The present invention is directed to a light emitting diode device that substantially obviates one or more of the problems due to limitations and disadvantages of the related art.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present invention provides a light emitting diode device including a) a light emitting diode (LED) chip with a highly reflective layer; and b) an angle-selective filter that transmits light with incidence angles smaller than a selective angle and reflects light with incidence angles larger than the selective angle. An air gap may be provided between the LED chip and the angle-selective filter. A polarizer may also be provided adjacent to the angle-selective filter in a light exit direction.

In another aspect, the present invention provides a device, which includes a light emitting layer which emits light; a substrate that transmits the emitted light, the light emitting layer formed over a first side of the substrate; a reflective layer formed over the first side of the substrate to reflect the emitted light, the light emitting layer positioned between the reflective layer and the substrate; and an angle-selective filter formed on a second side of the substrate, the angle-selective filter reflecting a light ray of the emitted light at an incident angle greater than a predefined incident angle and transmitting a light ray of the emitted light at an incident angle less than the predefined incident angle.

In yet another aspect, the present invention provides a device which includes a LED chip to emit light; a reflective layer formed over the first side of the LED chip to reflect the emitted light; and an angle-selective filter formed on a second side of the LED chip, the angle-selective filter reflecting a light ray of the emitted light at an incident angle greater than a predefined incident angle and transmitting a light ray of the emitted light at an incident angle less than the predefined incident angle.

DRAWINGS

Reference Numerals

100. LED chip
102. Light emitting layer of LED
104. Reflective layer of LED
106. Angle-selective filter
108. Optic fiber
110. Reflective polarizer
112. Quarter-wave plate

DETAILED DESCRIPTION OF THE PREFERRED EMBODIMENTS

One technique for improving LED performance is to use high driving currents to improve individual LED chip performance. This technique can be limited by the thermal dissipation of the LED chip. Other techniques for improving LED performance include incorporation of a reflective submount or a Bragg-grating into LED chips as described in, e.g., U.S. Pat. No. 6,849,878 B2 and U.S. Pat. No. 6,784,462 B2. These approaches can confine the light-emitting angular range and increase light brightness.

For certain applications, polarized lights from LEDs are preferred. A polarization conversion mechanism is needed to enhance the output brightness. One method to polarize LED lights is to put a reflective polarizer on the LED. Since the LED lights radiate at all angles, a reflective polarizer is used in some designs to polarize lights at all angles. This use of reflective polarizers can significantly compromise the degree of polarization in the output of such LED devices.

This application describes, among others, device designs and techniques to provide enhanced high brightness of light emitting diodes by using angle-selective optical filters. In some implementations, a high brightness light source can include a LED chip with a reflective layer and an angle-selective optical filter. The angle-selective filter transmits emitted light with an incidence angle smaller than a predefined selective angle (e.g., normal or closely normal to the filter) and reflects the light with an incidence angle larger than the predefined selective angle (e.g., off-normal to the filter). This selective angle can be determined by the design of the filter and can be varied from, e.g., 5 degrees to 75 degrees depending on specific requirements of applications.

The angle-selective filter can be located at the light exit path to reflect emitted light at large incidence angles back into the LED device. The highly reflective layer inside the LED (usually next to the light emitting active layer with 50% or higher reflectivity) reflects majority of the light back to the angle-selective filter at various angles. Light rays having small incidence angles can pass through the angle-selective optical filter and increase the total flux within the angle allowance of the angle-selective filter. As a result, the brightness is increased. Such an LED device can be configured to provide a low cost, high brightness light source using light emitting diode.

When polarized light is desirable, a reflective polarizer can be placed adjacently to the angle-selective filter to polarize the output light. Furthermore, a quarterwave plate can be inserted between the polarizer and the angle-selective filer in some applications.

Figure 1:
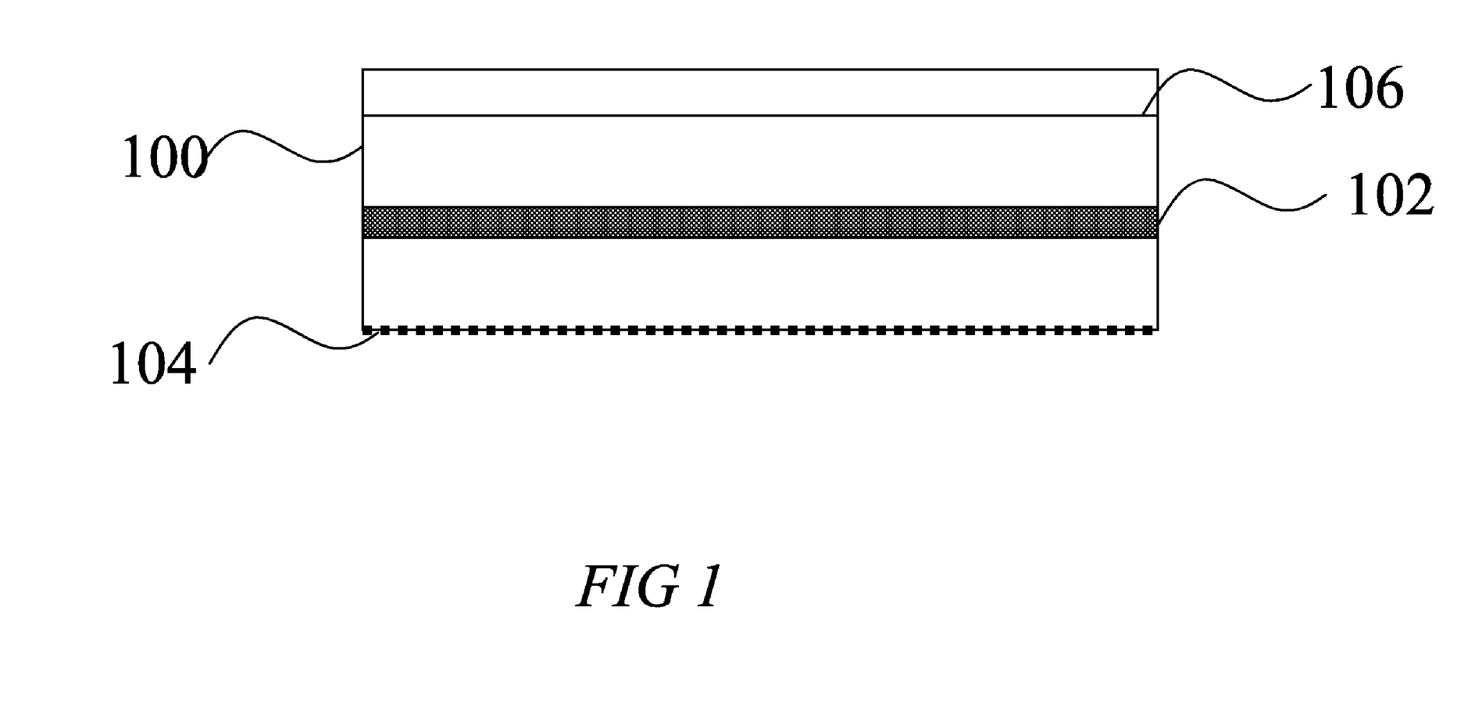
FIG. 1 is a cross section schematic view of an embodiment of the invention with an angle-selective optical filter.

FIG. 1 shows a simplified schematic view of an exemplary LED device based on one embodiment of the invention. This example LED device includes a LED chip substrate 100, a light emitting layer 102 formed of an active semiconductor medium, a highly reflective layer 104, and an angle-selective filter 106. The light emitting layer 102 is formed on a first side of the LED chip substrate 100 and is sandwiched between the LED chip substrate 100 and the highly reflective layer 104. The light-emitting layer 102 may emit light at a Lambertian pattern. Under this structure, the emitted light generated in the light emitting layer 102 is directed to transmit through the LED chip substrate 100 towards the second side of the LED chip substrate 100. The angle-selective filter 106 is formed on the second side of the LED chip substrate 100 and is designed to transmit light rays with an incidence angle smaller than a predefined selective angle (e.g., normal or closely normal to the filter) and to reflects light rays with incidence angles larger than the selective angle of the angle-selective filter 106, such as rays off-normal to the filter. The highly reflective layer 104 may absorb some of incoming light and reflects the majority incoming light at various angles towards the angle-selective filter 106. The angle-selective filter is located at the light exit path and should be close to 104. The selective angle of the filter 106 is determined by the characteristic of filter. This selective angle can be designed and fabricated from 5 degree to 75 degree to meet different application requirements.

Figure 2:
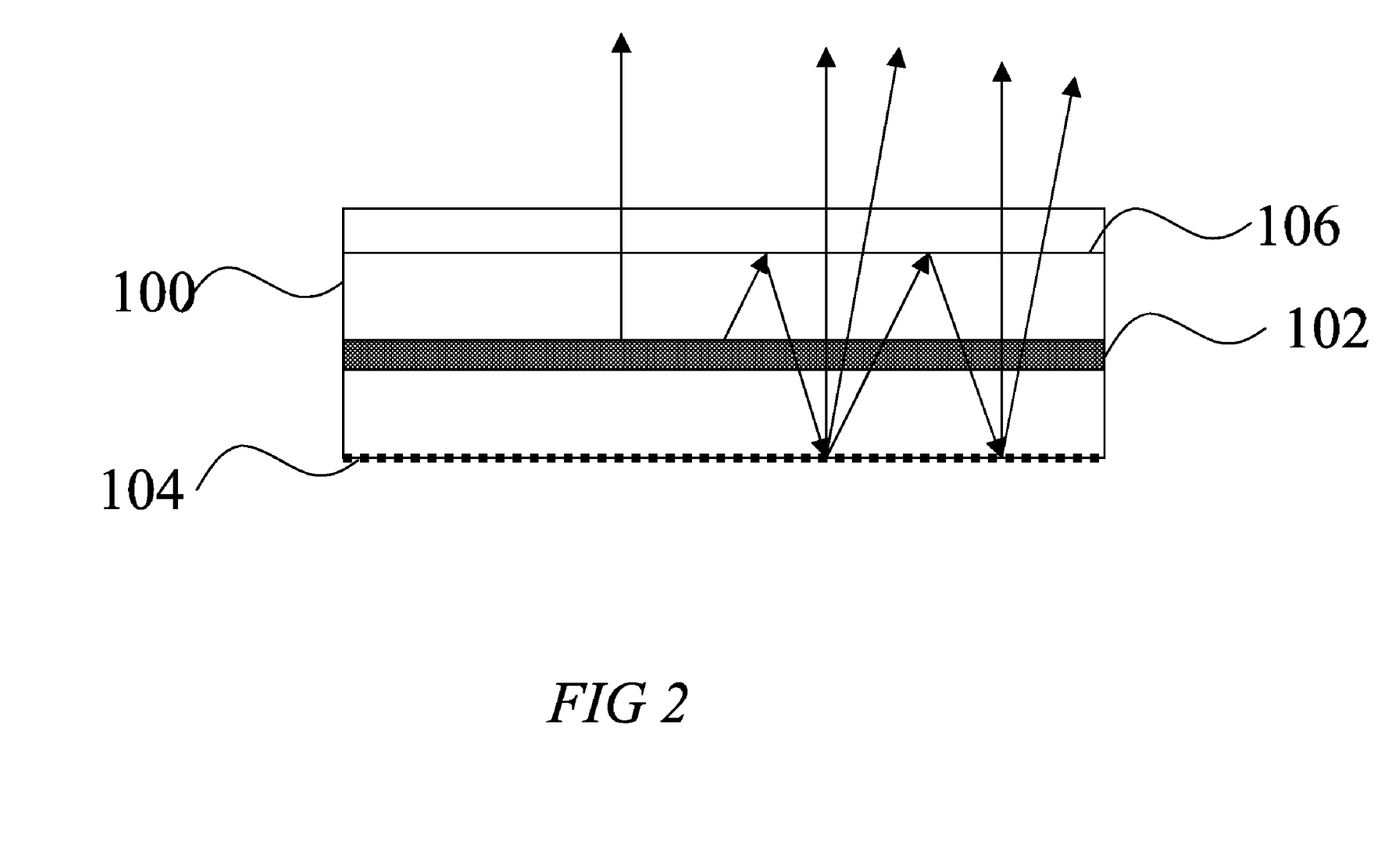
FIG. 2 is a schematic view of lights emitted from the active light-emitting layer of a LED and its further propagation under the influence of LED reflective layer and angle-selective optical filter.

FIG. 2 illustrates operation of the LED device in FIG. 1. Light rays emitted from 102 are in or close to Lambertian pattern, which means the lights radiate at all angles. Some of the lights propagate forward, other propagate back towards to 104. The forward lights with incidence angle smaller than selective angle of filter will transmit through 106. The forward lights with incidence angles larger than selective angle will be reflected by 106. The reflected lights will reach 104. Most of the lights (>50%) will be reflected by 104 in with Lambertian pattern and emit out from LED. Some of the reflected lights could be absorbed due to the absorption of 104. Once again, the lights with incidence angles smaller than the selective angle will transmit through 106. All other lights will be reflected back to 104 again by 106. Similarly, part of the lights with incidence angle larger than the selective angle gets converted by 104 and 106 to light with incidence angle smaller than selective angle. This process goes on and on. Therefore, the total lights flux within the selective angle is increased comparing to the case without 106. As a result, the brightness of the LED is enhanced.

Figure 3:
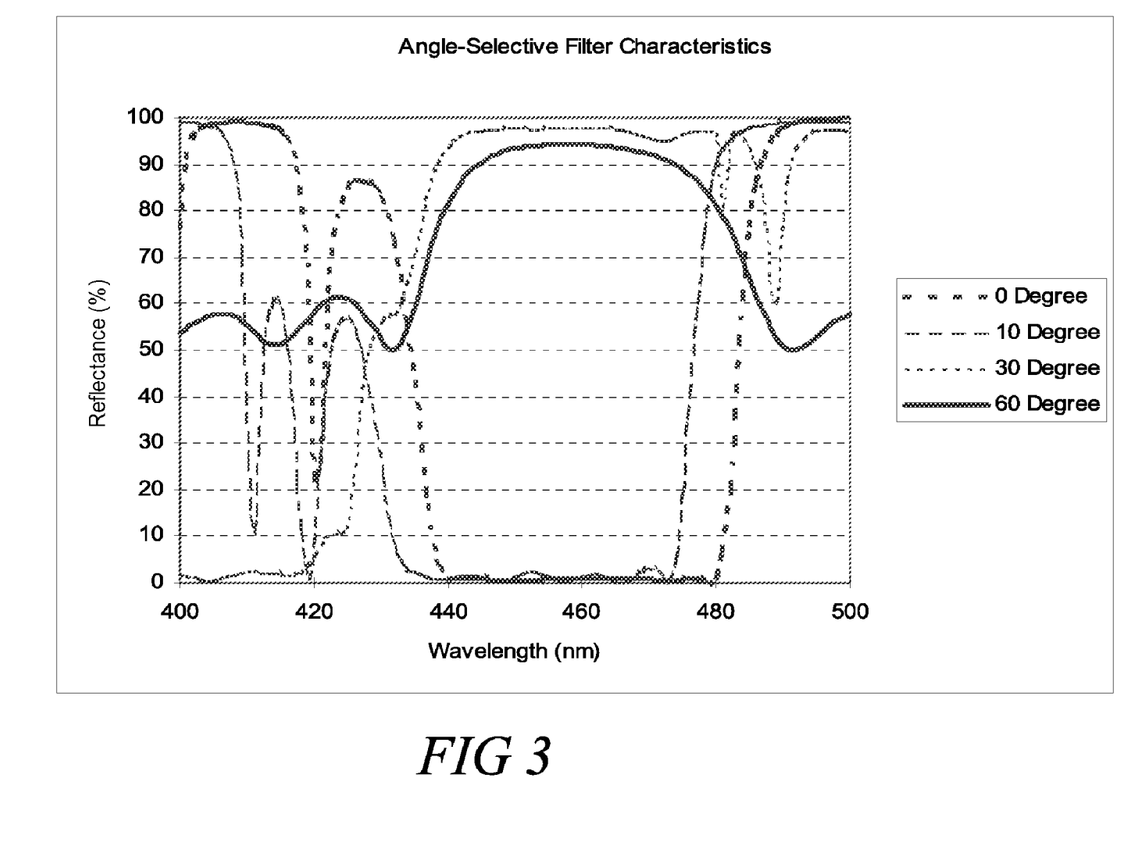
FIG. 3 is the spectra and angle characteristics of an angle-selective filter.

FIG. 3 illustrates the spectral characteristics of 106 with a specific selective angle in one example. Here a blue LED is used to illustrate the angle-selective effect. Lights from 445 nm to 475 nm are emitted from the blue LED. The light with small incidence angle such as 0 degree and 10 degree with respect to the normal direction of 106 will transmit through 106 at very small loss (<5%). The light with large incidence angle such as 30 degree and 60 degree will be almost reflected by 106. Obviously, the selective angle of this filter is around 20 degree. An angle-selective filter can be made of a thin film stack of two or more different dielectric layers. In some implementations, the thin film stack can be made of two different dielectric materials having different indices. For example, an angle-selective filter is made by using TiO2 (n=2.5) and SiO2 (n=1.46). The filter is designed as follows

| Layer | Thickness (nm) |
| --- | --- |
| TIO2 | 52.82 |
| SIO2 | 154.05 |
| TIO2 | 34.88 |
| SIO2 | 140.13 |
| TIO2 | 49.50 |
| SIO2 | 152.45 |
| TIO2 | 32.30 |
| SIO2 | 132.16 |
| TIO2 | 53.70 |
| SIO2 | 151.07 |
| TIO2 | 0.44 |
| SIO2 | 147.61 |
| TIO2 | 52.37 |
| SIO2 | 151.07 |
| TIO2 | 49.52 |
| SIO2 | 141.25 |
| TIO2 | 45.56 |
| SIO2 | 293.48 |
| TIO2 | 49.91 |
| SIO2 | 171.36 |
| TIO2 | 52.64 |
| SIO2 | 155.83 |
| TIO2 | 47.16 |
| SIO2 | 241.03 |
| TIO2 | 56.56 |
| SIO2 | 129.17 |
| TIO2 | 60.83 |
| SIO2 | 197.80 |
| TIO2 | 59.32 |
| SIO2 | 133.13 |
| TIO2 | 55.08 |
| SIO2 | 212.40 |
| TIO2 | 54.71 |
| SIO2 | 139.50 |
| TIO2 | 56.00 |
| SIO2 | 218.47 |
| TIO2 | 53.59 |
| SIO2 | 140.26 |
| TIO2 | 57.52 |

Figure 4:
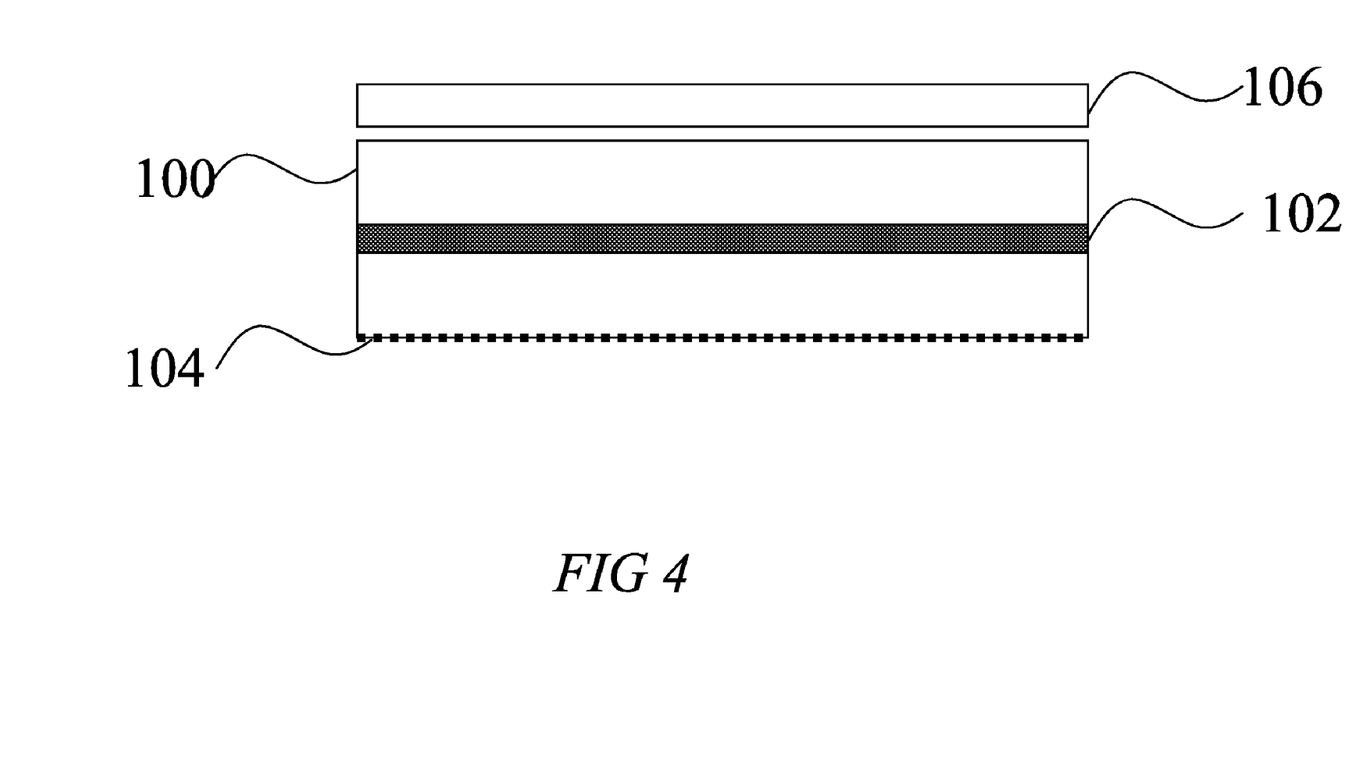
FIG. 4 is a cross section schematic view of an alternative embodiment of the invention with an angle-selective filter.

FIG. 4 shows a simplified schematic view of an alternative embodiment of the invention. The light emitting diode includes a LED chip 100 with an active emitting layer 102, a highly reflective layer 104 and an angle-selective filter 106. The angle-selective filter 106 transmits the light with incidence angle smaller than the selective angle (normal or closely normal to the filter) and reflects the light with incidence angle larger than the selective angle (off-normal to the filter). The highly reflective layer 104 reflects the majority of incoming lights at various angles. The emitting layer 104 emits lights at Lambertian pattern. The angle-selective filter is located at the light exit path. Between 106 and 100, there is a small air gap.

Figure 5:
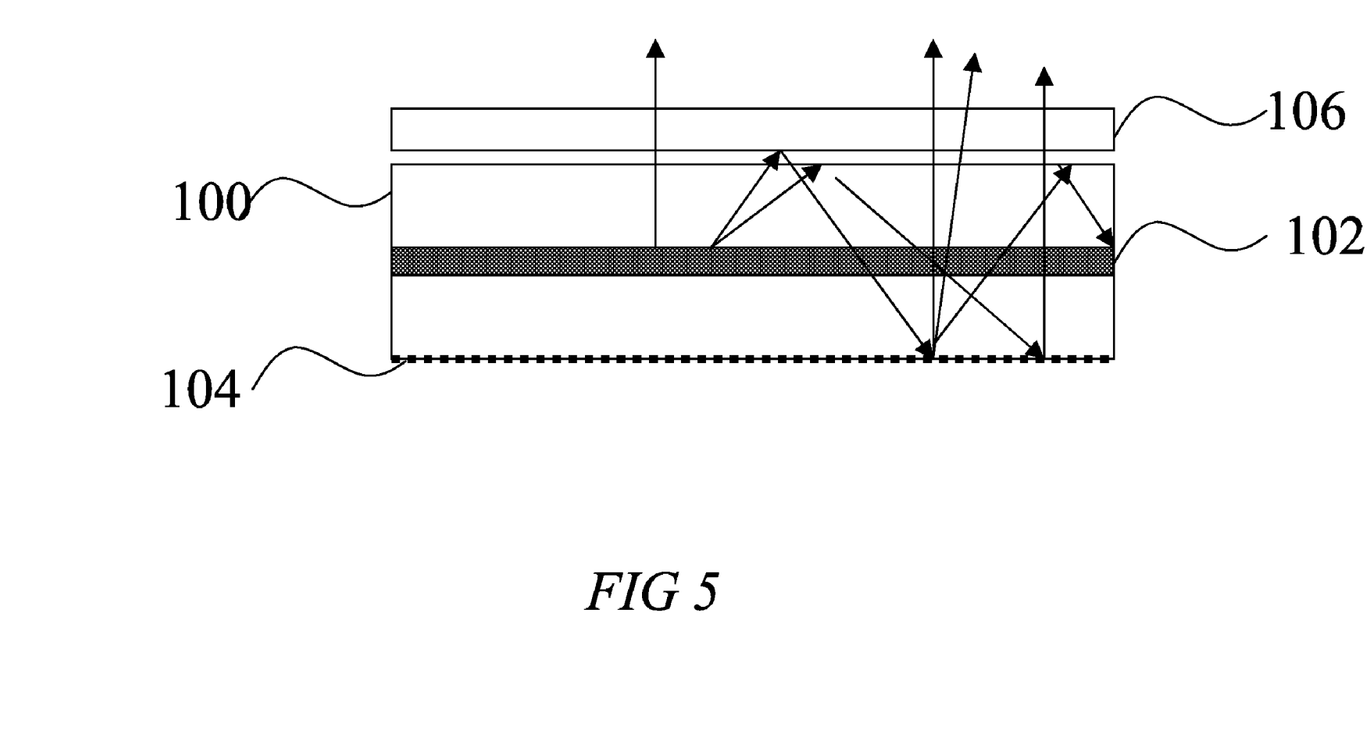
FIG. 5 is a schematic view of lights emitted from of active light-emitting layer of a light emitting diode and its further propagation under the influence of LED reflective layer and angle-selective optical filter.

In FIG. 5, the lights emitted from 102 are in Lambertian pattern, which means the lights are emitting at all angles. Some of the lights propagate forward, other propagate back towards to 104. The forward lights with small incidence angle will transmit through the air gap and 106. The forward lights with incidence angles larger than critical angle will be reflected by the air gap. Therefore, the gap serves as an angle-selective filer as well. 106 will further filter the lights that pass through the air gap. Therefore, the total flux of the small incidence angle lights is increased. As a result, the brightness of the LED is enhanced.

Figure 6:
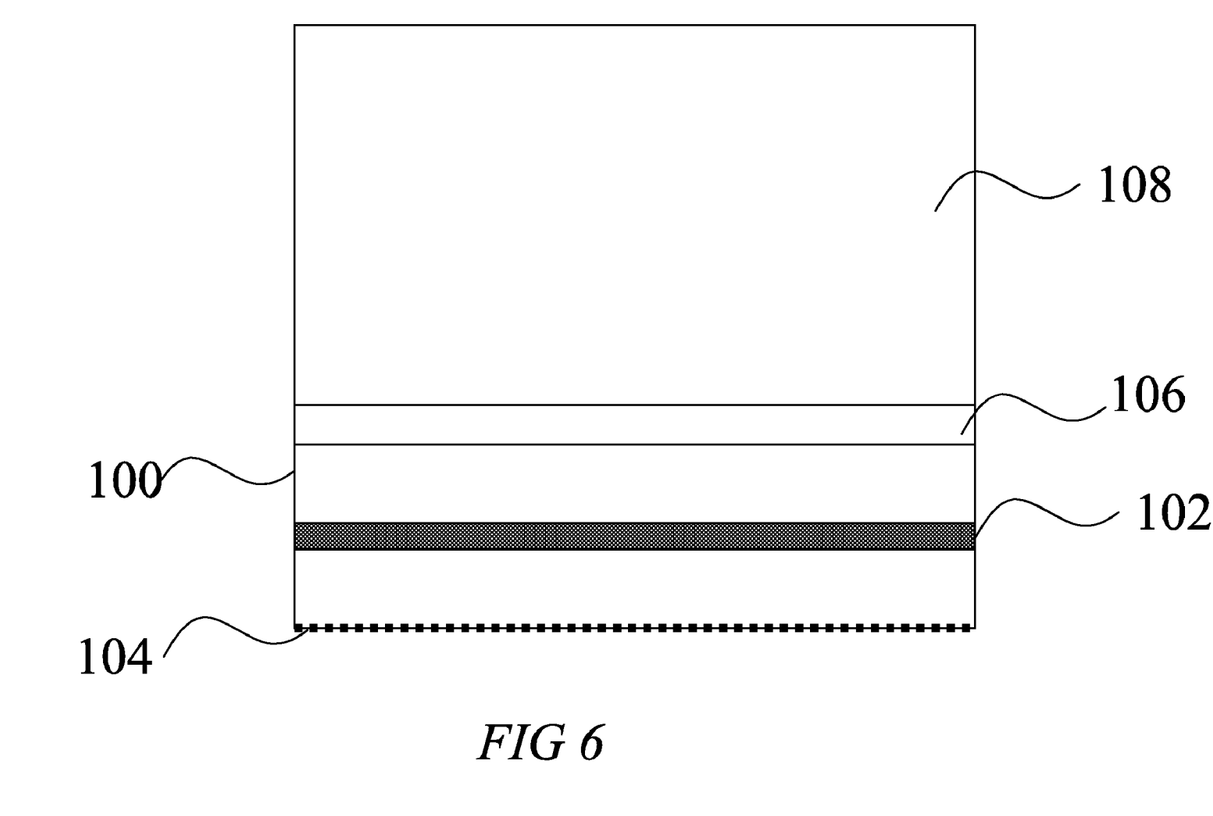
FIG. 6 is a cross section schematic view of an alternative embodiment of the invention with an optic fiber.

FIG. 6 shows a simplified schematic view of an alternative embodiment of the invention. The light emitting diode includes a LED chip 100 with light-emitting layer 102, a highly reflective layer 104, an angle-selective optical filter 106, and an optic fiber 108. The angle-selective filter 106 transmits the light with incidence angle smaller than the selective angle (normal or closely normal to the filter) and reflects the light with incidence angle larger than the selective angle (off-normal to the filter). The highly reflective layer 104 reflects the majority of incoming lights at various angles. The light-emitting layer 104 emits lights at (or close to) Lambertian pattern. The angle-selective filter is located at the light exit path. It can be directly contact with LED or through index matching resin. An optic fiber 108 is directly joined to 106 with index match gel (transparent to LED light) and receives the lights transmitted through 106. Since filter 106 will reduce the light-emitting angle, the more collimated output light will have higher coupling efficiency into fiber compared to the case without filter 106.

In FIG. 6, the selective angle of 106 matches the acceptance angle of 108. As a result, the lights transmitted through 106 can be efficiently coupled into 108 with little loss of brightness.

Figure 7:
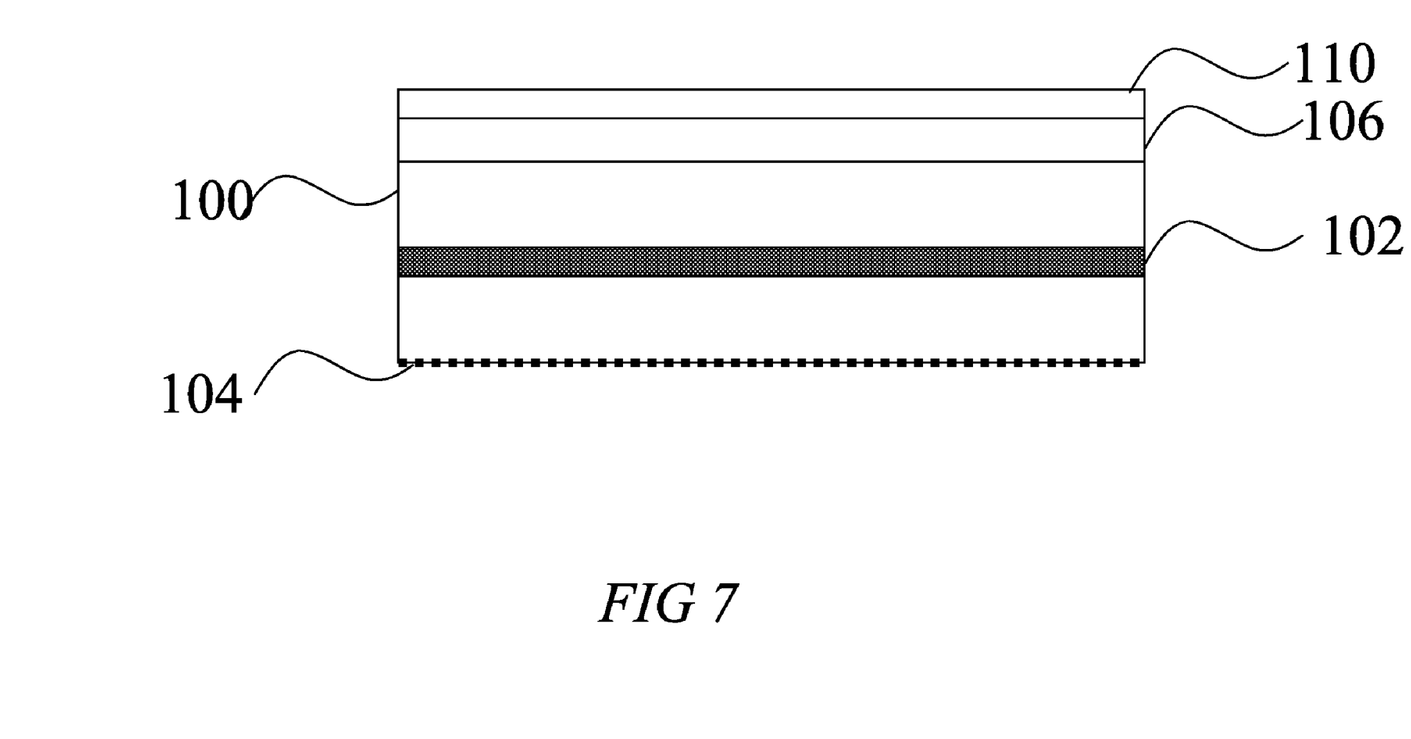
FIG. 7 is a cross section schematic view of an alternative embodiment of the invention with an optic reflective polarizer
Figure 8:
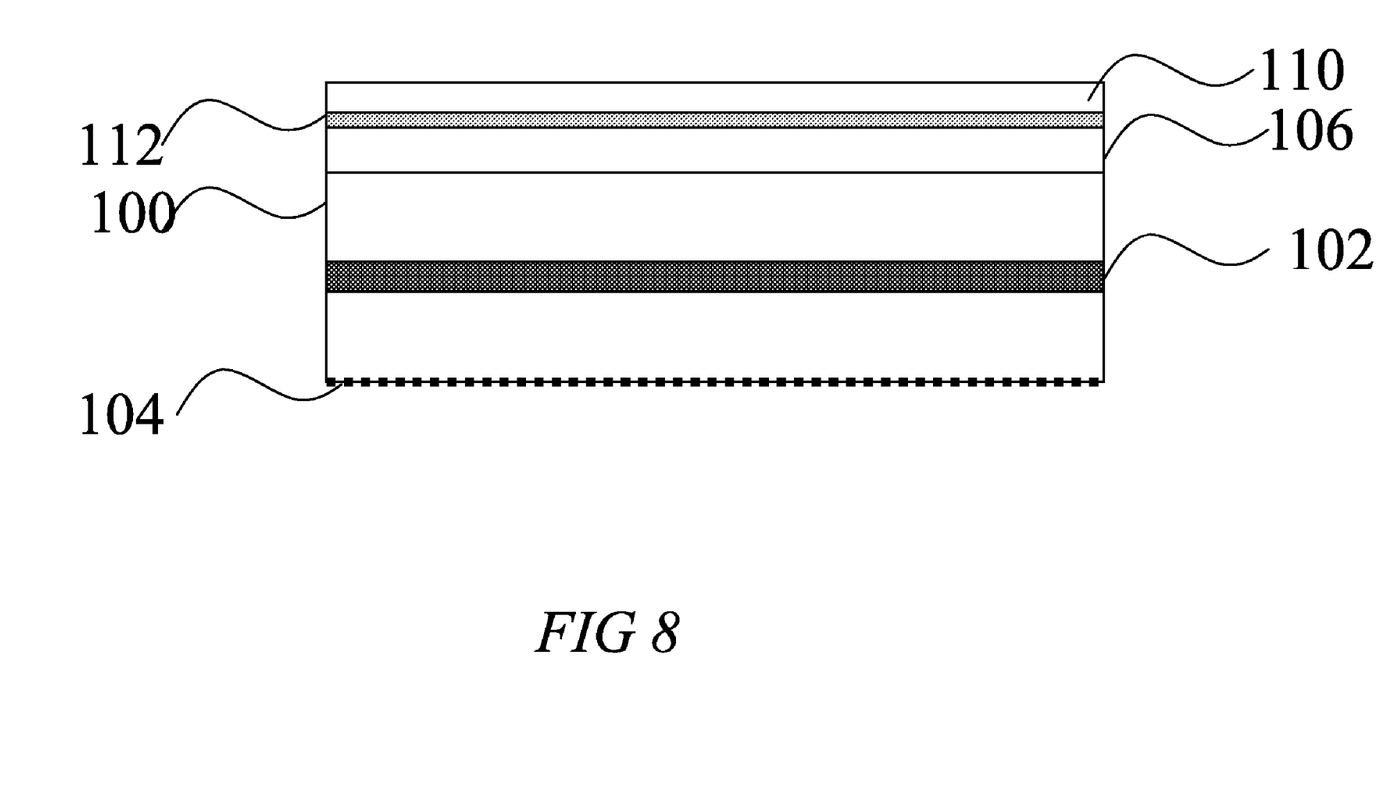
FIG. 8 is a cross section schematic view of an alternative embodiment of the invention with an optic reflective polarizer and an optical phase retarder.

In FIG. 7, a reflective polarizer 110 is placed adjacently to the filter 106. Since the filter 106 only passes a small angle lights to 110, the reflective polarizer 110 can effectively pass the preferred polarization state lights and reflect light rays in other polarization states including light with a polarization orthogonal to the preferred polarization state back to layers 106 and 100. The reflected light will be depolarized by the reflection of the reflective layer 104 and some of the lights get converted to the preferred polarization state and are directed to 106 and 110. As a result, there are more polarized lights out of 110 compared to the case without 106. Hence, the reflective nature of the polarizer 110 recycles the light not in the preferred polarization state and enhances the output efficiency of this polarized LED device. In some implementations, a quarter-wave plate can be inserted between the layers 106 and 110, as illustrated in FIG. 8. The quarter-wave plate can effectively convert the polarization state.

The LED devices described here can be implemented in configurations to achieve certain advantages. For example, one advantage of the described LED devices is an LED package that enhances brightness. Another advantage is that the described designs can be applied to various LED chips without requiring specially manufactured LED chips. Yet another advantage of the described designs is an efficient coupling from LED to optic fiber can be achieved because of the confined angular range of the output light produced by the angle-selective filter. In addition, the described LED designs can be used to provide an enhanced output of polarized light.

A few implementations and examples are described. Other variations and enhancements can be made based on what is described.

What is claimed is:

1. A light emitting diode device comprising:
    a) a light emitting diode (LED) chip with a highly reflective layer;
    b) an angle-selective filter that transmits light with incidence angles smaller than a selective angle and reflects light with incidence angles larger than the selective angle; and
    c) an air gap located between the LED chip and the angle-selective filter.

2. The light emitting diode device of claim 1, wherein the selective angle is between 5 to 75 degrees.

3. The light emitting diode device of claim 1, wherein the angle-selective filter is made of a stack of index-alternating films.

4. The light emitting diode device of claim 1, further comprising an optic fiber, wherein an acceptance angle of the optic fiber matches the selective angle of the angle-selective filter and wherein the optic fiber is joined to the angle-selective filter.

5. The light emitting diode device of claim 1, further comprising an optic fiber, wherein an acceptance angle of the optic fiber is equal to or larger than the selective angle of the angle-selective filter and wherein the optic fiber is joined to the angle-selective filter.

6. The light emitting diode device of claim 1, wherein the angle-selective filter is located in a light emitting path and the air gap is thinner than 1 mm.

7. The light emitting diode device of claim 1, further comprising an optic fiber, wherein an acceptance angle of the optic fiber matches the selective angle of the filter and the optic fiber is joined to the angle-selective filter.

8. A light emitting diode device comprising:
    a) a light emitting diode (LED) chip with a highly reflective layer;
    b) an angle-selective filter that transmits light with incidence angles smaller than a selective angle and reflects light with incidence angles larger than the selective angle; and
    c) a polarizer located adjacently to the angle-selective filter in a light exit direction.

9. The light emitting diode device of claim 8, wherein the polarizer is a reflective polarizer.

10. The light emitting diode device of claim 9, further comprising a phase retarder inserted between the polarizer and the angle-selective filter.

11. A device, comprising:
    a light emitting layer which emits light;
    a substrate that transmits the emitted light, the light emitting layer formed over a first side of the substrate;
    a reflective layer formed over the first side of the substrate to reflect the emitted light, the light emitting layer positioned between the reflective layer and the substrate; and
    an angle-selective filter formed on a second side of the substrate, the angle-selective filter reflecting a light ray of the emitted light at an incident angle greater than a predefined incident angle and transmitting a light ray of the emitted light at an incident angle less than the predefined incident angle.

12. The device as in claim 11, wherein the angle-selective filter comprises a stack of dielectric layers that comprise at least two different materials of different refractive indices.

13. The device as in claim 11, further comprising a reflective polarizer formed over the angle-selective filter on the second side of the substrate to transmit emitted light at a predetermined polarization state and reflect emitted light at a polarization state different from the predetermined polarization state.

14. The device as in claim 13, further comprising a phase retardation layer between the reflective polarizer and the angle-selective filter.

15. The device as in claim 11, further comprising a fiber having an end facet that is coupled to receive emitted light output by the angle-selective filter.

16. The device as in claim 11, further comprising an air gap located between the substrate and the angle-selective filter.

17. A device, comprising:

a light emitting diode (LED) chip to emit light;

a reflective layer formed over a first side of the LED chip to reflect the emitted light; and an angle-selective filter formed on a second side of the LED chip, the angle-selective filter reflecting a light ray of the emitted light at an incident angle greater than a predefined incident angle and transmitting a light ray of the emitted light at an incident angle less than the predefined incident angle.

18. The device as in claim 17, further comprising a fiber coupled to receive light from the angle-selective filter to guide emitted light from the LED chip.

19. The device as in claim 17, further comprising a reflective polarizer formed over the angle-selective filter on the second side of the LED device to transmit emitted light at a predetermined polarization state and reflect emitted light at a polarization state different from the predetermined polarization state.

20. The device as in claim 17, further comprising an air gap located between the LED chip and the angle-selective filter.

* * * * *